(12) United States Patent
Klunder et al.

(10) Patent No.: US 7,106,832 B2
(45) Date of Patent: Sep. 12, 2006

(54) APPARATUS INCLUDING A RADIATION SOURCE, A FILTER SYSTEM FOR FILTERING PARTICLES OUT OF RADIATION EMITTED BY THE SOURCE, AND A PROCESSING SYSTEM FOR PROCESSING THE RADIATION, A LITHOGRAPHIC APPARATUS INCLUDING SUCH AN APPARATUS, AND A METHOD OF FILTERING PARTICLES OUT OF RADIATION EMITTING AND PROPAGATING FROM A RADIATION SOURCE

(75) Inventors: Derk Jan Wilfred Klunder, Nijverdal (NL); Levinus Pieter Bakker, Helmond (NL); Vadim Yevgenyevich Banine, Helmond (NL); Maarten Marinus Johannes Wilhelmus Van Herpen, Heesch (NL)

(73) Assignee: ASML Netherlands B.V., Veldhoven (NL)

( * ) Notice: Subject to any disclaimer, the term of this patent is extended or adjusted under 35 U.S.C. 154(b) by 54 days.

(21) Appl. No.: 11/031,535

(22) Filed: Jan. 10, 2005

(65) Prior Publication Data

US 2006/0151717 A1    Jul. 13, 2006

(51) Int. Cl.
*G21K 3/00* (2006.01)

(52) U.S. Cl. .................... 378/156; 378/158; 250/505.1
(58) Field of Classification Search ............... 378/156, 378/157, 158, 159, 34, 145; 250/505.1, 492; 355/53, 55
See application file for complete search history.

(56) References Cited

U.S. PATENT DOCUMENTS

| | | | |
|---|---|---|---|
| 6,359,969 B1 | 3/2002 | Shmaenok | |
| 6,882,704 B1* | 4/2005 | Schriever et al. ........... 378/119 |
| 2003/0020890 A1 | 1/2003 | Ogushi et al. | |

* cited by examiner

*Primary Examiner*—Kiet T. Nguyen
(74) *Attorney, Agent, or Firm*—Pillsbury Winthrop Shaw Pittman, LLP

(57) ABSTRACT

Particles emitted by a radiation source, and moving from the radiation source towards a processing system for processing the radiation from the radiation source, are filtered out of radiation propagating through a predetermined cross section of the radiation as emitted by the radiation source by a filter system. The filter system includes a plurality of foils and a transporter for transporting the foils along a trajectory which extends within the beam so that the foils intercept the particles within the beam. The transporter is arranged to transport the foils by a substantially translatory movement of the foils along at least a part of the trajectory.

64 Claims, 4 Drawing Sheets

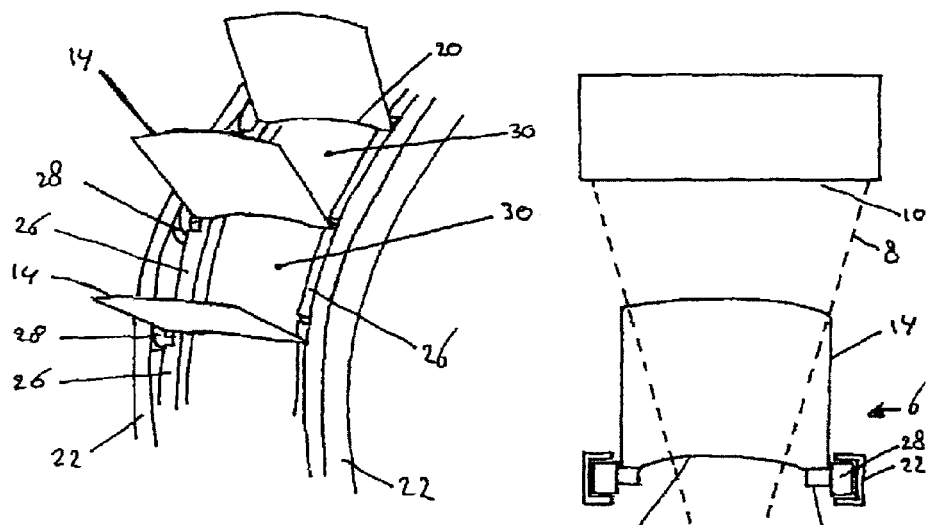
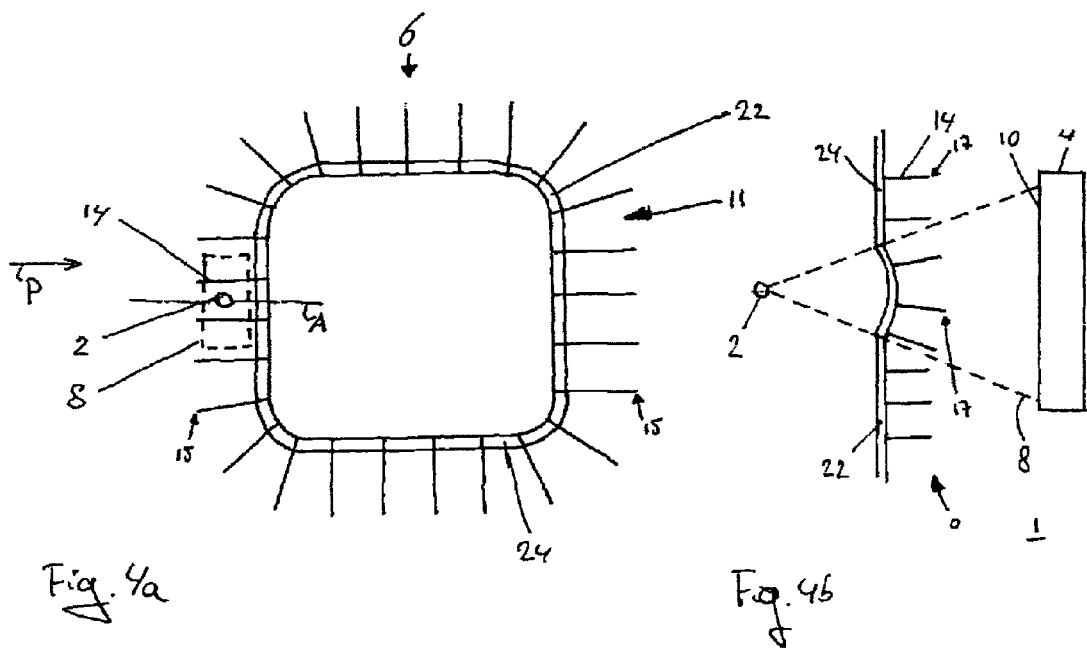

APPARATUS INCLUDING A RADIATION SOURCE, A FILTER SYSTEM FOR FILTERING PARTICLES OUT OF RADIATION EMITTED BY THE SOURCE, AND A PROCESSING SYSTEM FOR PROCESSING THE RADIATION, A LITHOGRAPHIC APPARATUS INCLUDING SUCH AN APPARATUS, AND A METHOD OF FILTERING PARTICLES OUT OF RADIATION EMITTING AND PROPAGATING FROM A RADIATION SOURCE

BACKGROUND OF THE INVENTION

1. Field of the Invention

The present invention relates to a method for filtering particles out of a beam of radiation propagating from a radiation source towards a processing system, a filter system, an apparatus and a lithographic apparatus including the filter system.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In order to be able to image smaller features, it has been proposed to use extreme ultraviolet radiation (EUV) with a wavelength in the range of 5 to 20 nm, particularly 13 nm, or a charged particle beam, e.g. an ion beam or an electron beam, as the exposure radiation in a lithographic apparatus. An example of an EUV radiation source is a laser plasma source. Plasma radiation sources, however, besides EUV radiation, often generate debris. Debris entering an illumination system and/or a projection lens should be entirely avoided or minimized.

U.S. Pat. No. 6,359,969, incorporated herein by reference, discloses a debris filter including a plurality of foils or plates, which foils or plates are arranged radially around the radiation source.

U.S. Patent Application Publication 2003/0020890 A1 discloses a debris removing system for preventing debris, originating from a radiation source, from entering an optical system. The debris removing system includes an attracting unit having an attracting surface approximately parallel to an axis passing through the radiation source. The debris removing system further includes a rotation unit for rotating the attracting unit about the axis. Part of the rotation unit blocks part of the radiation from entering the optical system, e.g. thus reducing the radiation transferring efficiency of the debris removing system Furthermore the attracting unit occupies a large volume close to the radiation source, so that placement of the debris removing system becomes difficult and/or the volume available for the radiation source is limited.

SUMMARY OF THE INVENTION

It is an aspect of the present invention to provide an apparatus including a radiation source, a processing system configured to process the radiation from the radiation source and a filter system configured to reduce the number of particles traveling away from the radiation source that reach the processing system, wherein the filter system provides for more freedom of design in positioning the filter system with respect to the radiation source as compared to filter systems known in the prior art.

According to an embodiment of the present invention, a lithographic apparatus, for example one suitable for extreme ultraviolet lithography, includes a radiation source; a processing system configured to process radiation from the radiation source; and a filter system configured to filter particles out of radiation propagating from the radiation source towards the processing system through a predetermined cross section of the radiation as emitted by the radiation source, wherein the filter system includes a plurality of foils or plates and a transporter configured to transport the foils or plates along a trajectory which extends partially within the radiation so that, in use, the foils or plates intercept the particles moving within the radiation, the transporter being configured to transport the foils or plates by a substantially translatory movement of the foils or plates along at least a part of the trajectory.

According to another embodiment of the present invention, a filter system for filtering particles out of radiation propagating through a predetermined cross section of the radiation as emitted by a radiation source, for example a source of extreme ultraviolet radiation, includes a plurality of foils or plates and a transporter configured to transport the foils or plates along a trajectory which extends, in use, within the radiation so that, in use, the foils or plates intercept the particles within the radiation, the transporter being configured to transport the foils or plates by a substantially translatory movement of the foils or plates along at least a part of the trajectory.

According to another embodiment of the present invention, a lithographic apparatus includes a radiation system configured to condition a radiation beam, the radiation system including a radiation source, a processing system configured to process radiation from the radiation source, and a filter system configured to filter particles out of the radiation propagating from the radiation source towards the processing system through a predetermined cross section of the radiation as emitted by the radiation source, wherein the filter system includes a plurality of foils or plates and a transporter configured to transport the foils or plates along a trajectory which extends within the radiation so that, in use, the foils or plates intercept the particles within the radiation, the transporter being configured to transport the foils or plates by a substantially translatory movement of the foils or plates along at least a part of the trajectory.

According to an aspect of the invention, a method of filtering particles out of radiation emitting from a radiation source and propagating through a predetermined cross section e radiation as emitted by a radiation source, includes transporting a plurality of foils or plates along a trajectory which extends within the radiation so that the foils or plates intercept the particles within the radiation, wherein the foils or plates are transported in a substantially translatory movement along at least a part of the trajectory.

In each of the above aspects of the present invention the foils or plates are transported in a substantially translatory movement along at least a part of the trajectory which extends within the beam. Incorporating the translatory movement of the foils allows the design of a multitude of possible trajectories. Hence the design of the trajectory can be chosen such that the design of the filter system can easily be adapted to dimensions and/or arrangements of the radiation source and/or processing system.

BRIEF DESCRIPTION OF THE DRAWINGS

Embodiments of the present invention will now be described, by way of example only, with reference to the accompanying schematic drawings in which corresponding reference symbols indicate corresponding parts, and in which:

FIG. 3b depicts a schematic perspective view of a detail of the apparatus shown in FIG. 3a;

FIG. 3c depicts a schematic section of the apparatus shown in FIG. 3a along line C;

FIG. 4a depicts a schematic view of an example of a third embodiment of an apparatus according to the present invention;

FIG. 4b depicts a schematic view of the apparatus shown in FIG. 4a in the direction of arrow P;

DETAILED DESCRIPTION

Figure 1:
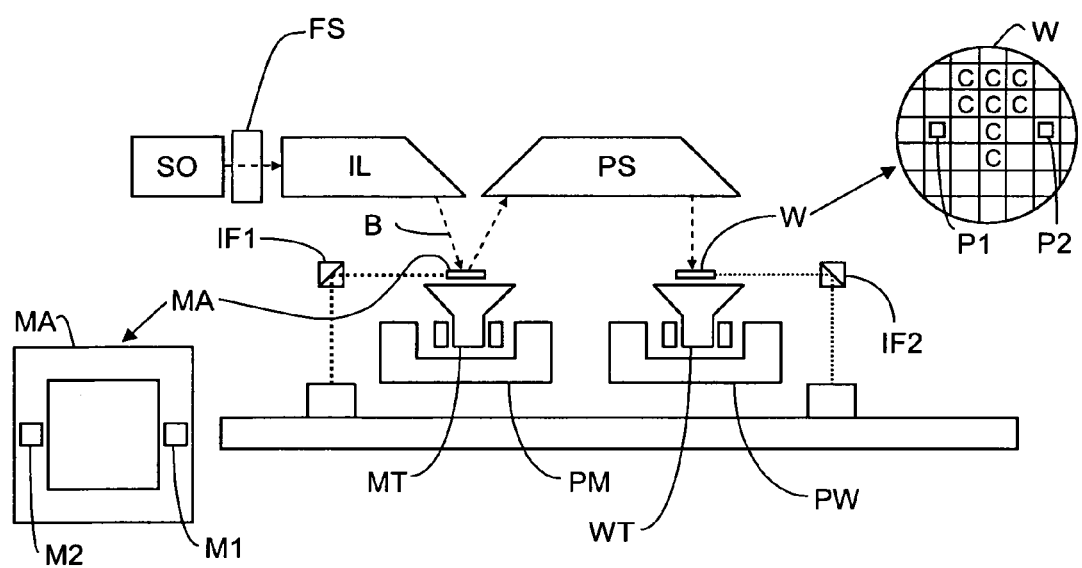
FIG. 1 depicts a lithographic apparatus according to an embodiment of the present invention.

FIG. 1 schematically depicts a lithographic apparatus according to an embodiment of the present invention. The apparatus includes an illumination system (illuminator) IL configured to condition a radiation beam B (e.g. EUV radiation). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory processes may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The radiation source may also produce debris particles. A filter system FS may be included to at least minimize the number of particles that, after leaving the radiation source SO, reach the illuminator IL. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
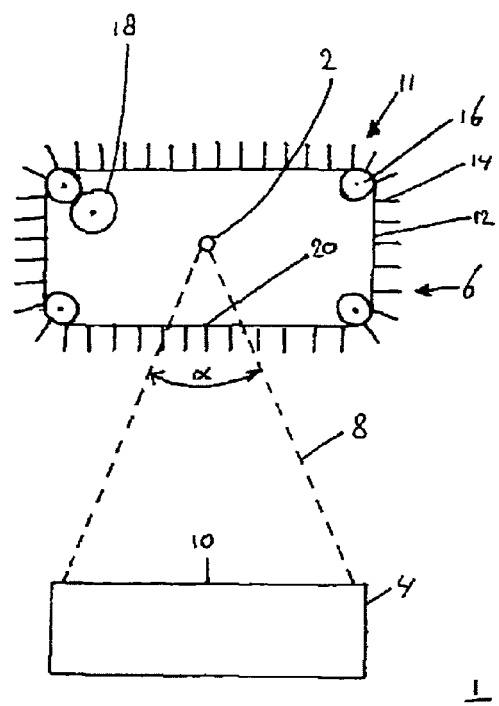
FIG. 2 depicts an example of a first embodiment of an apparatus according to the present invention.

FIG. 2 shows a first embodiment of an apparatus 1. The apparatus 1 includes a radiation source 2, a processing system 4, e.g. an illuminator IL, configured to process the radiation from the radiation source, and a filter system 6. The radiation source 2 may be a plasma radiation source, e.g. a Sn-source or a Xe-source. In the example of FIG. 2, the filter system 6 includes a transporter 11, which in this example includes a transport member 12, for example a conveyor belt, with a plurality of foils or plates 14, and a plurality of guides 16, for example wheels. In this example the conveyor belt 12 is configured as an endless loop. The wheels 16 are arranged to guide the conveyor belt 12. In this example the foils 14 are arranged orthogonal to the conveyor belt 12 and are spaced equidistantly with respect to each other. In the example of FIG. 2, the filter system further includes a drive unit 18. In this example the drive unit 18 is connected to a single wheel 16. The drive unit 18 drives conveyor belt 12 through the wheel 16 connected to the drive unit 18. In this example the foils 14 on the conveyor belt 12 may be continuously moved in one direction. It will be appreciated that it is also possible to alternate the direction in which the foils are transported.

The radiation source 2 emits radiation, e.g. EUV radiation with a wavelength in the range of 5 to 20 nm. Radiation 8 propagates through a predetermined cross section 10, e.g. through an entrance opening of the processing system 4. The radiation 8 has an opening angle α, of approximately 90°, for example. In this example the radiation source 2 also emits debris. The debris may be emitted from the radiation source 2 in a flight direction, which is the same direction as the radiation propagation direction, in this example radially away from the radiation source, with a velocity $v_{debris}$. The radiation and debris pass between the foils 14. The debris may slow down and/or change direction, for example by collision with other debris particles and/or molecules or atoms of a present gas.

In use, the foils 14 are transported by the conveyor belt 12 so that the foils intercept debris particles traveling from the radiation source 2 towards the processing system 4. The foils 14 may be transported in a direction with at least a component in a direction perpendicular to the respective foils. The foils 14 are transported by a substantially translatory movement. A movement in general includes a translatory and a rotational component. In the strict sense, rotation is any circular motion of a body around a center (e.g. center of gravity) of the body. In the strict sense, revolution is any circular motion of the body around a point which is not the center of the body. In the strict sense, translation is any displacement of the body, wherein an angular orientation of the body with respect to a fixed coordinate system is preserved. Any arbitrary movement of the body can be thought to be composed of translatory and rotational components. In this description the term substantially translatory movement or translation describes any movement of a body which is not pure rotation and/or pure revolution in the strict sense.

The apparatus 1 is suited for lithography, for example extreme ultraviolet lithography, and includes the radiation source 2, the processing system 4 to process the radiation from the radiation source and the filter system 6 to filter particles out of the radiation 8 propagating from the radiation source 2 towards the processing system through the predetermined cross-section 10 of the radiation as emitted by the radiation source 2. The filter system 6 includes the plurality of foils or plates 14 and the transporter 11 to transport the foils or plates along the trajectory which at least, partially, crosses the radiation 8 in such a way that, in use, the foils or plates 14 intercept the particles in the beam 8. Further, the transporter 11 is arranged to transport the foils or plates 14 by a substantially translatory movement of the foils or plates along at least part of the trajectory. The apparatus thus offers more freedom of design in positioning the filter system 6 with respect to the radiation source 2, than apparatus in which the movement of the foils is a pure rotation and/or a pure revolution.

The foils 14 are translated in a direction substantially perpendicular to an optical axis, which axis, in this embodiment, extends from the source 2 to the processing system 4. As the foils are transported, in this embodiment translated, they will intercept some passing debris particles, thereby reducing the number of particles traveling from the radiation source 2 towards the processing system 4, as compared to the situation in which no filter system 6 is used. In case the debris particles travel in a direction parallel to the foils 14, a time of flight τ of the debris particles between the foils with a length L, in the direction in which the debris particles fly, is given by $\tau = L/v_{debris}$. When the foils 14 are spaced apart over a distance d, and when the transport velocity $v_{trans}$ of the foils is larger than a minimum transport velocity $v_{trans, min} = d \times v_{debris}/L$, debris particles with the velocity lower than or equal to $v_{debris}$ will collide with the translating foils 14. Debris particles that stick to the foils 14, will not be transferred through the filter system 6 to the processing system 4.

In use, the radiation from the radiation source 2 passes the translating foils 14. As the radiation travels at the speed of light, the radiation is hardly intercepted by the foils. Radiation directly incident on the foils 14, for example on edges 20 of the foils, which edges are directed towards the radiation source 2, will be obstructed by the foils. A radiation transmission efficiency of the filter system 6 depends inter alia on the distance d between the foils 14, and a thickness of the respective foils. In the embodiment of FIG. 2, the conveyor belt 12 is located outside the radiation 8 that passes through the predetermined cross section 10. The conveyor belt 12 does not obstruct the radiation 8 going to the processing system 4 between the foils 14. Thus, interference of the beam 8 by the conveyor belt 12 is excluded or reduced. The conveyor belt 12 may be arranged on one side of the radiation 8. The conveyor belt 12 may also be arranged as two parallel belts, one on either side of, or next to, the radiation 8.

Figure 3A:
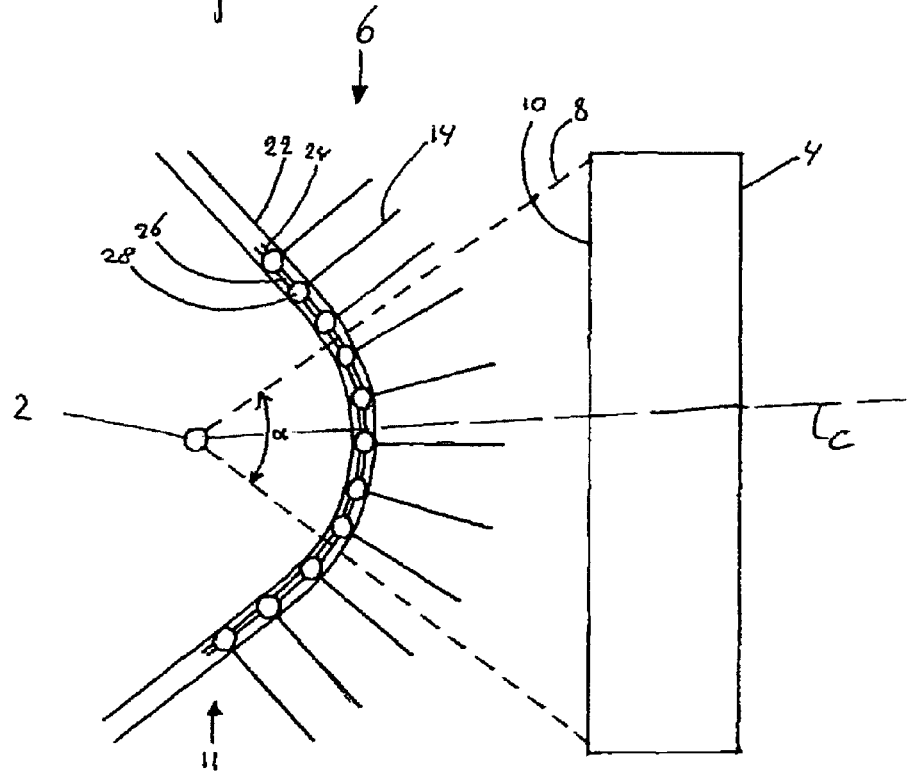
FIG. 3a depicts a schematic top view of an example of a second embodiment of an apparatus according to the present invention.

FIGS. 3a, 3b and 3c show a second embodiment of the apparatus 1. FIG. 3a shows a schematic top view of an embodiment of the apparatus 1. FIG. 3b shows a schematic perspective view of a detail of the apparatus shown in FIG. 3a. FIG. 3c shows a schematic section of the apparatus shown in FIG. 3a along line C. Referring to FIG. 3a, the radiation source 2 generates radiation and debris particles, which, in this embodiment, are emitted radially away from the source 2. The radiation 8 propagating through the predetermined cross section 10, e.g. through the entrance opening of the processing system 4, has an opening angle α. In the embodiment of FIG. 3a each foil 14 substantially extends in a virtual plane that intersects the radiation source 2, at least within the radiation 8 through the predetermined cross section 10. The radiation 8 is parallel to the foils 14 within the radiation 8. In this way the foils 14 intercept a minimum amount of radiation from the radiation source 2. In the embodiment of FIG. 3a, the foils 14 need not be parallel to the radiation from the radiation source 2 outside the radiation 8 because radiation outside the beam does not enter the processing system 4. Additionally, part of the transporter 11 is not subjected to impinging radiation or debris particles. This allows for cooling and/or cleaning of the transporter 11 and/or the foils 14. For that purpose, the apparatus 1 may include a cooling unit and/or a cleaning unit, wherein the foils 14 are first transported through the radiation 8 and subsequently to the cooling unit and/or cleaning unit, or vice versa. It is also possible that the foils 14 are alternately transported through the beam and to the cooling unit and/or the cleaning unit. The cleaning unit may be arranged to at least partly remove the debris particles from the foils and/or the transporter. The cooling unit may be arranged to at least reduce the temperature of the foils and/or the transporter. It is also possible to use the cooling unit and/or cleaning unit in combination with the embodiments of the apparatus shown in FIGS. 2, 4a, 4b, 5 and 6.

The transporter 11 includes a guide 22 and a transport member 24. The transport member is a chain which includes segments 26 and guide wheels 28. The segments 26 are connected to each other to form the chain, which chain is flexible to follow a contour of the guide structure 22. The guide wheels 28 allow the chain to follow the contour of the guide 22. Each of the foils 14 is arranged on one of the segments 26. A single foil is connected to each segment of the chain. It is also possible that multiple foils are arranged on a single segment and/or that a plurality of segments is not connected to foils. The chain includes two separate sub-chains. Between the sub-chains and the foils openings 30 are provided. The openings 30 allow radiation to pass from the radiation source 2 to the processing system 4. The sub-chains may be spaced apart far enough so as not to obstruct radiation going from the source 2 to the processing system 4, and so that interference of the transporter with the radiation is excluded.

The foils are transported along a trajectory defined by the guide 22. The trajectory, at least within the radiation 8 that passes through the predetermined cross section 10, substantially follows an arc of a virtual circle, the center of the virtual circle substantially coinciding with the source 2. At each position of the trajectory within the radiation 8 the trajectory is orthogonal to the radiation emitted by the source 2. The foils 14 that are orthogonal to the transport member 24, are therefore parallel to the radiation from the source 2, at any position within the radiation 8. Obstruction of radiation by the filter system 6 is, therefore, limited to radiation impinging on the edges 20 of the foils 14.

The foils 14 are provided with curved sides towards the source 2 and towards the processing system. Each curve is part of a circle with the source 2 at the center. The curved shape of the foil makes substantially all particles travel the same distance along the foils 14. The debris particles are thus intercepted in a homogeneous fashion, the minimum speed $v_{debris,min}$ required to pass the filter system 6 being substantially the same along the entire surface of the foil within the radiation 8.

The foils 14 are transported, at least within the radiation 8, along the trajectory which extends in a virtual plane that intersects the radiation source 2, in this embodiment the drawing plane. Thus, when viewed from the position of the source 2, the foils 14 appear to be translated in a rectilinear motion within the radiation 8. This also provides that the debris particles are intercepted in a homogeneous fashion.

FIGS. 4a and 4b show a schematic view of a third embodiment the apparatus 1. FIG. 4a shows the filter system 6 viewed from the location of the processing system. FIG. 4b shows the apparatus 1 as viewed in the direction of arrow P in FIG. 4a. In the embodiment of FIGS. 4a and 4b, the transporter 11 is configured to transport the foils or plates 14 on one side of a plane through the source 2 normal to the optical axis, which optical axis extends from the source 2 to the processing system 4. Thus, the transporter 11 can be arranged in front of the source 2, when viewed from the processing system 4, and need not be wrapped around the source. The positioning and mechanical layout of both the filter system 6 and the source 2 can thus be less constrained than with the transporter 11 wrapped around the source 2, or with rotating foils. In the embodiment of FIGS. 4a and 4b, the foils 14 are transported along the trajectory, which trajectory, within the radiation 8, substantially follows an arc of a virtual circle, as can be seen in FIG. 4b. The center of the virtual circle substantially coincides with the source 2. The foils will thus be transported substantially parallel to the radiation at each position within the radiation 8.

The foils 14 are directed substantially radially away from a center of the guide 22. The foils are connected to the transport member 24 on at least one point on the side of the respective foils, adjacent a corner of the respective foil. It is also possible that the respective foils are connected to the transport member at a different point, e.g. the point that is closest to a center of the guide 22. The foils 14 may also be connected to the transport member 24 along a side of the respective foils, e.g. the side that is closest to the center of the guide 22. It is also possible that the foils are directed substantially radially inwards, towards the center of the guide 22. It is also possible that the foils are connected to multiple transport members, e.g. the transport member 24 shown in FIG. 4a and a second transport member which may be arranged at a distance from the transport member 24, e.g. near free edges 15 of the foils 14 or free edges 17 of the foils 14. It is possible that the foils 14 are connected to multiple transport members at multiple points of the respective foils 14. It is also possible that the foils 14 are connected to multiple transport members at multiple sides of the respective foils 14. It is also possible to use multiple transport members in the embodiments of the filter system shown in FIGS. 2, 3a–c, 5 and 6.

Figure 5:
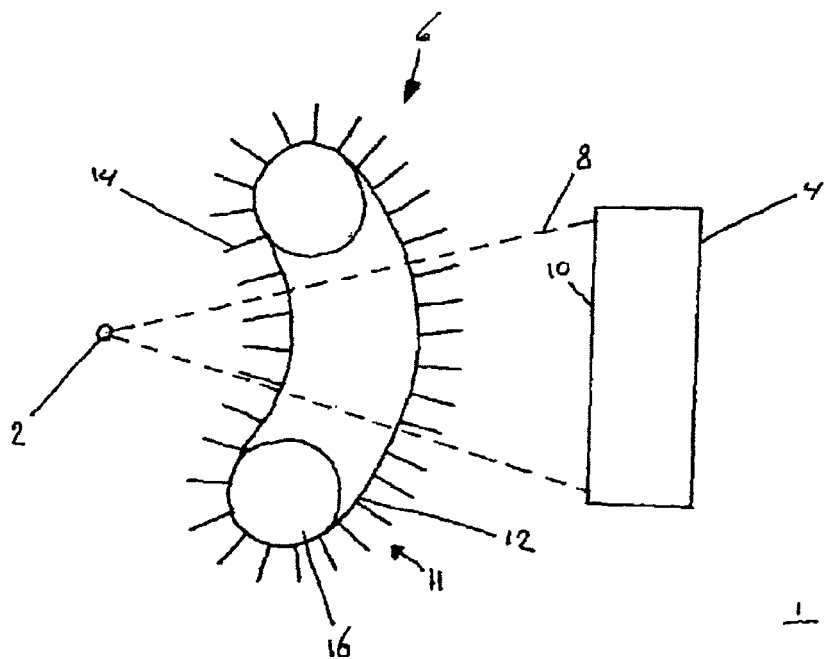
FIG. 5 depicts a fourth embodiment of an apparatus according to the present invention.

FIG. 5 shows a fourth embodiment of the apparatus 1. The apparatus 1 includes the radiation source 2, the processing system 4 and the filter system 6. The filter system 6 includes the transporter 11, which includes the conveyor belt 12, with the plurality of foils or plates 14, and the plurality of guides 16, such as wheels. The conveyor belt 12 is arranged as a closed loop. The wheels 16 are arranged to guide and/or drive the conveyor belt 12. The foils 14 are arranged orthogonal to the conveyor belt 12 and are spaced equidistantly with respect to each other. Starting from a predetermined translational position of the conveyor belt 12, the conveyor belt 12, and thus each foil 14, passes the radiation 8 twice before the conveyor belt 12 again reaches the predetermined translational position. Debris particles that pass the first line of foils 14 can still be intercepted by the second line of foils, thus increasing efficiency of the filter system 6.

Debris particles are emitted by the source in a radial direction. Due to collision with other particles, for example, the flight direction of the debris particles may change. It will be appreciated that debris particles with a velocity component in the direction in which the foils are transported, are more likely to pass the filter system 6, by staying ahead of the foil that chases the particle, than debris particles with a velocity component in the direction opposite to the direction in which the foils are transported. The foils pass the radiation 8 twice in substantially opposite directions. Thus, the debris particle with a velocity component in the direction in which the first line of foils is transported, automatically has a velocity component in the direction opposite to the direction in which the second line of foils is transported, and vice versa. The filter system 6 thus provides homogeneous, and efficient, interception of the debris particles.

The first line of foils and the second line of foils are transported, within the radiation 8, along a trajectory which follows an arc of a virtual circle. The center of the virtual circle may coincide with the source 2. Thus, the transporter is orthogonal to the radiation 8 and the foils are parallel to the radiation 8. The obstruction of radiation by the filter system 6 is thus limited to radiation impinging on the thin edges 20 of the foils 14.

Figure 6:
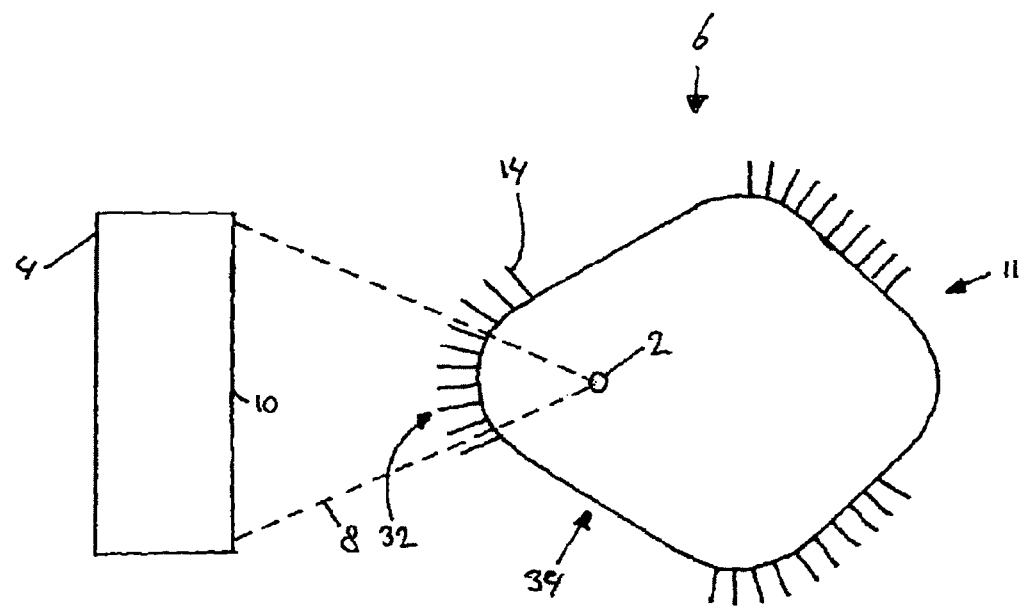
FIG. 6 depicts a fifth embodiment of an apparatus according to the present invention.

FIG. 6 shows a fifth embodiment of the apparatus 1. The apparatus 1 includes the radiation source 2, the processing system 4 and the filter system 6. The filter system 6 includes the transporter 11, which includes a first region 32, in which a first plurality of foils or plates 14 is arranged, and a second region 34, adjacent the first region 32, which is free from foils or plates. The radiation source 2 is a pulsed source, which delivers radiation and debris particles during a first period, and which delivers less, or no, radiation and debris particles during a second period. The radiation and debris particles are generated substantially simultaneously by the source. The propagation velocity of the radiation, however, is higher than a flight velocity of the debris particles. Due to the difference in velocities, the radiation will arrive at the part of the filter system 6 within the radiation 8 sooner than the debris particles. The transporter 11 is arranged to intercept the particles by transporting the first plurality of foils 14 in the first region 32 of the transporter 11, within the radiation 8, while the debris particles traverse the filter system 6 within the radiation 8. The transporter is arranged to exclude interference of the transporter with the radiation by transporting the second region 34 of the transporter 11, which is free from foils, within the radiation 8, while the radiation traverses the filter system 6 within the radiation. Thus, debris particles that pass the filter system 6 within the radiation 8 may be intercepted by the transported foils. Radiation that passes the filter system 6 within the radiation 8 is not obstructed by foils. The radiation transmission efficiency of the filter system is high, while effectively intercepting debris particles. The apparatus 1 may include a synchronization unit configured to synchronize the transporter 11 with the pulsed source 2, or to synchronize the pulsed source 2 with the transporter 11. The transporter 11 continuously transports the first and second regions 32, 34. It should be appreciated that it is also possible to transport the foils 14 when debris passes, and to halt the transporter when radiation passes, when using a transporter including only a first region 32.

In the first region 32 a first plurality of foils is arranged, and in the second region 34 foils are absent. It should be appreciated that it is also possible to include a first plurality of foils in the first region, and a second plurality of foils in the second region. The first plurality and second plurality of foils may have different properties, such as spacing between the foils, length of the foils, thickness of the foils, foil material, etc. It shouldl be appreciated that it is also possible that the transporter 11 is arranged to completely block passage of debris, for example by providing in the first region 32 of the transporter 11 a closure, within the radiation 8, while the debris particles attempt to pass the filter system 6 within the radiation 8, and that the transporter is arranged to transport a plurality of foils in the second region 34 of the transporter 11, within the radiation 8, while the radiation, and possibly some debris, passes the filter system 6.

As disclosed above, the transporter is arranged as a closed loop, allowing the foils to be continuously transported in one direction. It should be appreciated that it is also possible to alternately transport the foils back and forth. It should be appreciated that it is also possible that the transporter is not arranged as a closed loop, but is arranged for alternately transporting, possibly vibrating, the foils back and forth, at least within the radiation 8.

It is possible that the filter system is further provided with a plurality of stationary foils or plates. The stationary foils or plates may, at least within the beam, substantially extend in a virtual plane that intersects the radiation source. The plurality of stationary foils may be arranged between the source 2 and the transporter 11 and/or between the processing system 4 and the transporter 11. The plurality of stationary foils may be arranged between the source 2 and the plurality of foils 14 configured to be transported along the trajectory and/or between the processing system 4 and the plurality of foils 14 arranged to be transported along the trajectory. Providing the filter system with the stationary foils provides that the debris particles can be filtered out of the radiation 8 more efficiently.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the invention may be used in other applications, for example optical analysis and illumination in general. The terms "radiation" and "beam" used herein encompass all types of electromagnetic radiation, including ultraviolet (UV) radiation (e.g. having a wavelength of or about 365, 355, 248, 193, 157 or 126 nm), extreme ultra-violet (EUV) radiation (e.g. having a wavelength in the range of 5–20 nm) and (soft) X-Ray radiation, as well as particle beams, such as ion beams or electron beams.

The term "lens", where the context allows, may refer to any one or combination of various types of optical components, including refractive, reflective, magnetic, electromagnetic and electrostatic optical components.

While embodiments of the present invention have been described above, it will be appreciated that the present invention may be practiced otherwise than as described. For example, the present invention may take the form of a computer program containing one or more sequences of machine-readable instructions executable by, for example a programmed general purpose computer or ASIC, to instruct an apparatus to perform a method as disclosed above, or a data storage medium (e.g. semiconductor memory, magnetic or optical disk) having such a computer program stored therein.

The descriptions above are intended to be illustrative, not limiting. Thus, it will be apparent to those of ordianry skill in the art that modifications may be made to the present invention as described without departing from the scope of the claims set out below.

What is claimed is:

1. An apparatus, comprising:
   a radiation source configured to generate radiation;
   a processing system configured to process the radiation from the radiation source; and
   a filter system configured to filter particles out of the radiation propagating from the radiation source towards the processing system through a predetermined cross section of the radiation as emitted by the radiation source, wherein the filter system includes a plurality of foils and a transporter configured to transport the foils along a trajectory which extends within the radiation so that, in use, the foils intercept the particles moving within the radiation, the transporter being configured to transport the foils by a substantially translatory movement of the foils along at least a part of the trajectory.

2. An apparatus according to claim 1, wherein the filter system is configured so that at least one of the foils within the radiation substantially extends in a virtual plane that intersects the radiation source.

3. An apparatus according to claim 1, wherein, in use, within the radiation, the foils are transported in a direction having at least a component in a direction perpendicular to the foils.

4. An apparatus according to claim 1, wherein within the radiation the trajectory extends in a virtual plane that intersects the source.

5. An apparatus according to claim 1, wherein a part of the trajectory that extends within the radiation substantially coincides with an arc of a virtual circle.

6. An apparatus according to claim 5, wherein the center of the virtual circle substantially coincides with the source.

7. An apparatus according to claim 1, wherein the transporter is configured so that in use interference of the transporter with the radiation is excluded.

8. An apparatus according to claim 1, wherein the foils are arranged equidistantly with respect to each other.

9. An apparatus according to claim 1, wherein the transporter includes a drive unit configured to drive the foils.

10. An apparatus according to claim 9, wherein the drive unit drives a transport member of the transporter, and wherein the foils are arranged on the transport member.

11. An apparatus according to claim 10, wherein the transport member includes a conveyor belt or chain.

12. An apparatus according to claim 10, wherein the transport member includes segments and each of the foils is arranged on one of the segments.

13. An apparatus according to claim 10, wherein the transport member is configured as a closed loop.

14. An apparatus according to claim 13, wherein, in use, starting from a predetermined translational position of the transport member, each of the foils passes the radiation at least twice before the transport member again reaches the predetermined translational position.

15. An apparatus according to claim 1, wherein, at least within the radiation, the foils are configured orthogonal to the transporter.

16. An apparatus according to claim 15, wherein, at least within the radiation, the foils are maintained substantially orthogonal to the transporter by a centrifugal force acting on the foils.

17. An apparatus according to claim 1, wherein, in use, at least within the radiation, the foils are continuously transported in one direction.

18. An apparatus according to claim 1, wherein at least one of the foils extends from the transporter in a direction pointing away from the source.

19. An apparatus according to claim 1, wherein the transporter is configured to intercept the particles if the particles traverse the filter system, and to exclude interference of the transporter with the radiation if the radiation traverses the filter system.

20. An apparatus according to claim 19, wherein the transporter includes a first region, in which a first plurality of foils is arranged to intercept the particles, and a second region, adjacent the first region, which is free from foils, to exclude interference with the radiation.

21. An apparatus according to claim 1, wherein the radiation source is configured to emit EUV radiation.

22. A filter system for filtering particles out of radiation emitted by a radiation source and propagating through a predetermined cross section, the filter system comprising:
a plurality of foils; and
a transporter configured to transport the foils along a trajectory which extends, in use, within the radiation, so that the foils intercept the particles within the radiation, the transporter being configured to transport the foils by a substantially translatory movement of the foils along at least a part of the trajectory.

23. A filter system according to claim 22, wherein the filter system is configured so that at least one of the foils within the radiation substantially extends in a virtual plane that intersects the radiation source.

24. A filter system according to claim 22, wherein, in use, within the radiation, the foils are transported in a direction having at least a component in a direction perpendicular to the foils.

25. A filter system according to claim 22, wherein within the radiation the trajectory extends in a virtual plane that intersects the source.

26. A filter system according to claim 22, wherein a part of the trajectory that extends within the radiation substantially coincides with an arc of a virtual circle.

27. A filter system according to claim 26, wherein the center of the virtual circle substantially coincides with the source.

28. A filter system according to claim 22, wherein the transporter is configured so that in use interference of the transporter with the radiation is excluded.

29. A filter system according to claim 22, wherein the foils are arranged equidistantly with respect to each other.

30. A filter system according to claim 22, wherein the transporter includes a drive unit configured to drive the foils.

31. A filter system according to claim 30, wherein the drive unit drives a transport member of the transporter, and wherein the foils are arranged on the transport member.

32. A filter system according to claim 31, wherein the transport member includes a conveyor belt or chain.

33. A filter system according to claim 31, wherein the transport member includes segments and each of the foils is arranged on one of the segments.

34. A filter system according to claim 31, wherein the transport member is configured as a closed loop.

35. A filter system according to claim 34, wherein, in use, starting from a predetermined translational position of the transport member, each of the foils passes the radiation at least twice before the transport member again reaches the predetermined translational position.

36. A filter system according to claim 22, wherein, at least within the radiation, the foils are configured orthogonal to the transporter.

37. A filter system according to claim 36, wherein, at least within the radiation, the foils are maintained substantially orthogonal to the transporter by a centrifugal force acting on the foils.

38. A filter system according to claim 22, wherein, in use, at least within the radiation, the foils are continuously transported in one direction.

39. A filter system according to claim 22, wherein at least one of the foils extends from the transporter in a direction pointing away from the source.

40. A filter system according to claim 22, wherein the transporter is configured to intercept the particles if the particles traverse the filter system, and to exclude interference of the transporter with the radiation if the radiation traverses the filter system.

41. A filter system according to claim 40, wherein the transporter includes a first region, in which a first plurality of foils is arranged to intercept the particles, and a second region, adjacent the first region, which is free from foils, to exclude interference with the radiation.

42. A filter system according to claim 22, wherein the radiation source is configured to emit EUV radiation.

43. A lithographic apparatus, comprising:
a radiation system configured to condition a radiation beam, the radiation system comprising
a radiation source configured to generate radiation, a processing system configured to processing the radiation, and a filter system configured to filter particles out of the radiation propagating from the radiation source towards the processing system through a predetermined cross section of the radiation as emitted by the radiation source, wherein the filter system includes a plurality of foils and a transporter configured to transport the foils along a trajectory which extends within the radiation so that, in use, the foils intercept the particles within the radiation, the transporter being configured to transport the foils by a substantially translatory movement of the foils along at least a part of the trajectory.

44. An apparatus according to claim 43, wherein the filter system is configured so that at least one of the foils within the radiation substantially extends in a virtual plane that intersects the radiation source.

45. An apparatus according to claim 43, wherein, in use, within the radiation, the foils are transported in a direction having at least a component in a direction perpendicular to the foils.

46. An apparatus according to claim 43, wherein within the radiation the trajectory extends in a virtual plane that intersects the source.

47. An apparatus according to claim 43, wherein a part of the trajectory that extends within the radiation substantially coincides with an arc of a virtual circle.

48. An apparatus according to claim 47, wherein the center of the virtual circle substantially coincides with the source.

49. An apparatus according to claim 43, wherein the transporter is configured so that in use interference of the transporter with the radiation is excluded.

50. An apparatus according to claim 43, wherein the foils are arranged equidistantly with respect to each other.

51. An apparatus according to claim 43, wherein the transporter includes a drive unit configured to drive the foils.

52. An apparatus according to claim 51, wherein the drive unit drives a transport member of the transporter, and wherein the foils are arranged on the transport member.

53. An apparatus according to claim 52, wherein the transport member includes a conveyor belt or chain.

54. An apparatus according to claim 52, wherein the transport member includes segments and each of the foils is arranged on one of the segments.

55. An apparatus according to claim 52, wherein the transport member is configured as a closed loop.

56. An apparatus according to claim 55, wherein, in use, starting from a predetermined translational position of the transport member, each of the foils passes the radiation at least twice before the transport member again reaches the predetermined translational position.

57. An apparatus according to claim 43, wherein, at least within the radiation, the foils are configured orthogonal to the transporter.

58. An apparatus according to claim 57, wherein, at least within the radiation, the foils are maintained substantially orthogonal to the transporter by a centrifugal force acting on the foils.

59. An apparatus according to claim 43, wherein, in use, at least within the radiation, the foils are continuously transported in one direction.

60. An apparatus according to claim 43, wherein at least one of the foils extends from the transporter in a direction pointing away from the source.

61. An apparatus according to claim 43, wherein the transporter is configured to intercept the particles if the particles traverse the filter system, and to exclude interference of the transporter with the radiation if the radiation traverses the filter system.

62. An apparatus according to claim 61, wherein the transporter includes a first region, in which a first plurality of foils is arranged to intercept the particles, and a second region, adjacent the first region, which is free from foils, to exclude interference with the radiation.

63. An apparatus according to claim 43, wherein the radiation source is configured to emit EUV radiation.

64. A method of filtering particles out of radiation emitting from a source and propagating through a predetermined cross section, the method comprising:

transporting a plurality of foils along a trajectory which extends within the radiation so that the foils intercept the particles within the radiation, wherein the foils are transported in a substantially translatory movement along at least a part of the trajectory.

* * * * *